United States Patent [19]

Kurisu

[11] Patent Number: 5,625,295
[45] Date of Patent: Apr. 29, 1997

[54] BIPOLAR TRANSISTOR CIRCUIT CAPABLE OF HIGH PRECISION MEASUREMENT OF CURRENT AMPLIFICATION FACTOR

[75] Inventor: Masakazu Kurisu, Tokyo, Japan

[73] Assignee: NEC Corporation, Tokyo, Japan

[21] Appl. No.: 350,062

[22] Filed: Nov. 29, 1994

[30] Foreign Application Priority Data

Nov. 29, 1993 [JP] Japan .................................. 5-320848

[51] Int. Cl.⁶ .................................................. G01R 27/26
[52] U.S. Cl. ........................ 324/719; 324/768; 327/380; 330/290
[58] Field of Search ......................... 327/411, 374, 327/375, 380; 330/290, 2; 324/713, 719, 768, 769

[56] References Cited

U.S. PATENT DOCUMENTS

| | | | |
|---|---|---|---|
| 3,348,145 | 10/1967 | Erath | 324/768 |
| 3,350,641 | 10/1967 | Lubkin et al. | 324/768 |
| 3,376,568 | 4/1968 | Stewart | 327/380 |
| 4,268,798 | 5/1981 | Reichart | 330/290 |
| 4,275,453 | 6/1981 | Wagner | 330/290 |
| 5,286,656 | 2/1994 | Keown et al. | 324/768 |

FOREIGN PATENT DOCUMENTS

| | | |
|---|---|---|
| 361253479 | 11/1986 | Japan . |
| 1237466 | 9/1989 | Japan . |

OTHER PUBLICATIONS

Johnston et al. IEEE Transactions on Nuclear Science vol. NS–22, No. 6, Dec. 1975.

Lewis. Wireless World May 1973 Meterless Transistor Testor vol. 79, No. 1451.

*Primary Examiner*—Maura K. Regan
*Attorney, Agent, or Firm*—Sughrue, Mion, Zinn, Macpeak & Seas

[57] ABSTRACT

In a semiconductor device, a first resistor is connected between the base and collector of a dummy bipolar transistor, a second resistor is connected between the base and emitter of the dummy bipolar transistor, and a third resistor is connected to the collector of the dummy bipolar transistor. A first pad and a second pad are connected to the base and emitter, respectively, of the dummy bipolar transistor. A third pad is connected to the third resistor. A fourth pad is connected to the collector of the dummy bipolar transistor.

4 Claims, 6 Drawing Sheets

BIPOLAR TRANSISTOR CIRCUIT CAPABLE OF HIGH PRECISION MEASUREMENT OF CURRENT AMPLIFICATION FACTOR

BACKGROUND OF THE INVENTION

1. Field of the Invention

The present invention relates to a semiconductor device, and more particularly, to a bipolar transistor formed in a semiconductor substrate or the like capable of a high precision measurement of a current amplification factor $\beta$.

2. Description of the Related Art

In a semiconductor device including bipolar transistors, a current amplification factor $\beta$ is a parameter resulting from a manufacturing process. That is, even when the manufacturing process is accurately carried out, the current amplification factor $\beta$ greatly fluctuates. For example, the current amplification factor $\beta$ may often be increased to twice a target value or may be often be decreased to half the target value.

Therefore, in a testing stage of a wafer, a measurement of a current amplification factor $\beta$ is performed upon one or more dummy bipolar transistors. As a result, if the measured current amplification factor $\beta$ is deviated from an optimum range, this entire wafer is determined to be defective and is scraped. In view of this, it is important to accurately measure a current amplification factor of a dummy bipolar transistor.

In a first prior art dummy bipolar transistor circuit, three pads are provided for a base, an emitter and a collector, respectively, of a dummy bipolar transistor. Then, probes are contacted to the pads, so that a base voltage $V_1$ and a power supply voltage $V_{cc}$ are applied to the base and the collector, respectively. Thus, a base current $I_B$ and a collector current $I_C$ are monitored and a current amplification factor $\beta$ is calculated by $$\beta = I_C/I_B$$

This will be explained later in detail.

In the first dummy bipolar transistor circuit, however, since the collector current $I_C$ is exponentially dependent upon the base voltage $V_1$, the base voltage $V_1$ applied from the exterior needs to be very precise. Also, since a parasitic oscillation may occur due to a high frequency operation of the bipolar transistor, it is impossible to precisely measure the current amplification factor $\beta$. In this case, the frequency f of the parasitic oscillation can be represented by $$f = 1/2\pi \cdot \sqrt{LC}$$

where L is a parasitic inductor of one probe; and
C is a parasitic capacity of one pad. For example, if L=10 nH and C=1 pF, then the frequency f is 1.6 GHz, which enables an oscillation in the newest bipolar transistor having a cut-off frequency of tens of GHz.

In a second prior art dummy bipolar transistor circuit, first and second resistors are added to the first prior art dummy bipolar transistor circuit. That is, the first resistor is connected between the base and the collector of the dummy bipolar transistor, and the second resistor is connected between the base and the emitter of the dummy bipolar transistor. Thus, the base voltage is self-biased by the first and second resistors without application from the exterior. In this case, the current amplication factor $\beta$ is calculated by $$\beta = \frac{R_1 \cdot I_{CC} - V_{CC} + V_1}{V_{CC} - (1 + R_1/R_2) \cdot V_1}$$

where $R_1$ is a resistance value of the first resistor;
$R_2$ is a resistance value of the second resistor;
$V_{CC}$ is a voltage at the pad connected to the collector;
$V_1$ is a voltage at the pad connected to the base; and
$I_{CC}$ is a current flowing through the third pad. This will be explained later in detail.

In the second prior art dummy bipolar transistor circuit, however, since the current amplification factor $\beta$ is dependent upon an absolute value of the second resistor whose precision is about several tens of a percent, a measurement error of the current amplification factor $\beta$ is very large. Also, a parasitic oscillation may occur in the same way in the second prior art dummy bipolar transistor circuit where the collector is connected directly to the power supply pad.

In a third prior art dummy bipolar transistor circuit, operational amplifiers and a current mirror circuit are provided, thereby enabling a measurement of a current amplification factor $\beta$ without depending on the absolute value of resistors (see JP-A-HEI1-237466).

In the third prior art dummy bipolar transistor circuit, however, the presence of the operational amplifiers and the current mirror circuit reduces the integration. Also, it is difficult to introduce such accurate operational amplifiers into a digital semiconductor integrated circuit. Thus, the third prior art dummy bipolar transistor circuit is difficult in actual practical use.

SUMMARY OF THE INVENTION

It is, therefore, an object of the present invention to provide a dummy bipolar transistor circuit capable of an accurate and easy measurement of a current amplification factor without inviting a parasitic oscillation.

According to the present invention, in a semiconductor device, a first resistor is connected between the base and collector of a dummy bipolar transistor, a second resistor is connected between the base and emitter of the dummy bipolar transistor, and a third resistor is connected to the collector of the dummy bipolar transistor. A first pad and a second pad are connected to the base and emitter, respectively, of the dummy bipolar transistor. A third pad is connected to the third resistor. A fourth pad is connected to the collector of the dummy bipolar transistor.

Thus, a current amplification factor $\beta$ is calculated by $$\beta = (R_2/R_3) \cdot ((V_{CC}-V_2)-(R_3/R_1) \cdot (V_2-V_1))/((R_2/R_1) \cdot (V_2-V_1)-V_1-GND)$$

where $R_1$, $R_2$ and $R_3$ are resistance values of the first, second and third resistors, respectively;
GND is a voltage at the second pad;
$V_{CC}$ is a voltage at the third pad;
$V_1$ is a voltage at the first pad; and
$V_2$ is a voltage at the fourth pad.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, prior art dummy bipolar transistor circuits will be explained with reference to FIGS. 1 and 2.

Figure 1:
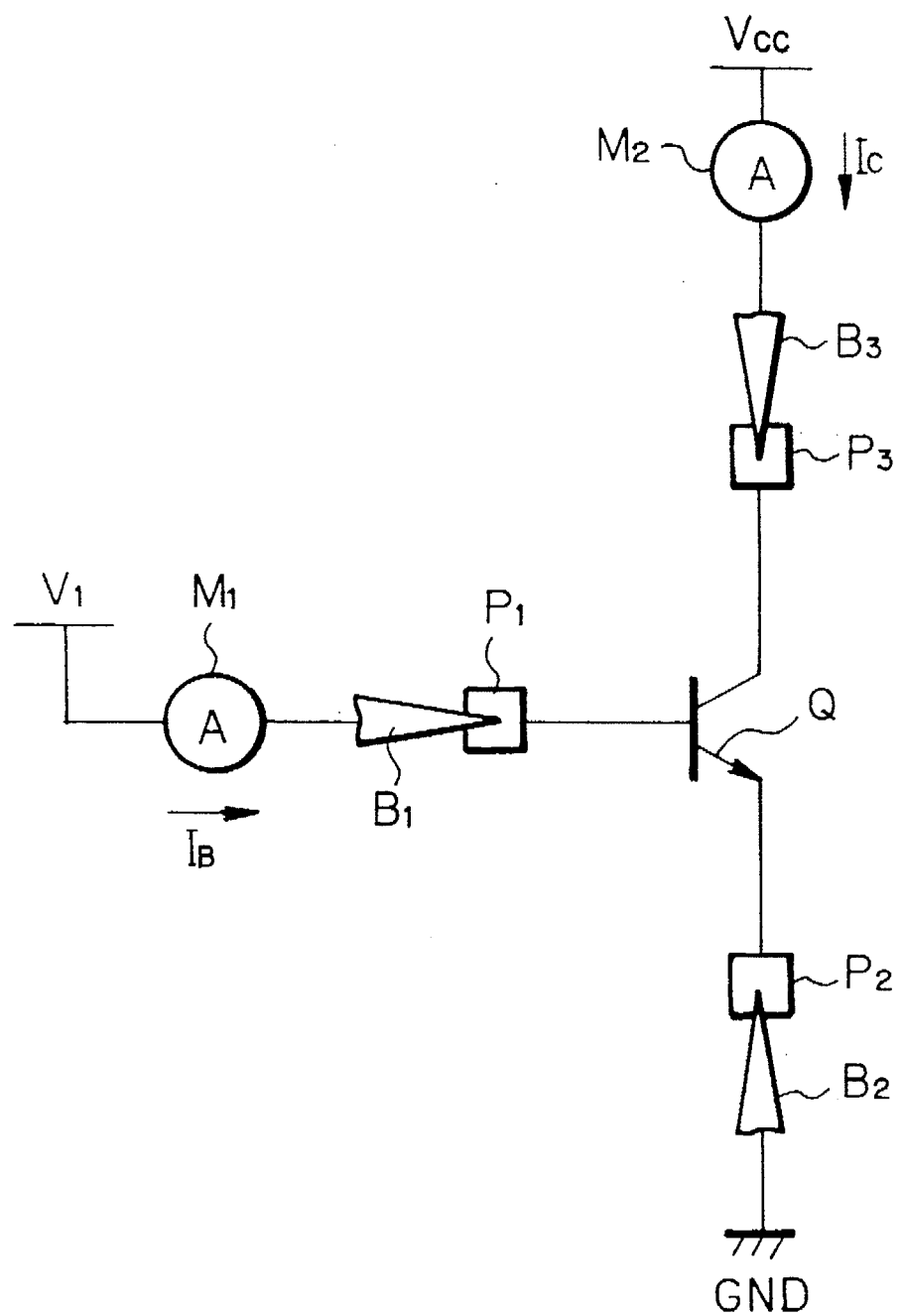
FIG. 1 is a circuit diagram illustrating a first prior art dummy bipolar transistor circuit.

In FIG. 1, which illustrates a first prior art dummy bipolar transistor circuit, pads $P_1$, $P_2$ and $P_3$ are connected to a base, an emitter and a collector, respectively, of a dummy bipolar transistor Q. Then, probes $B_1$, $B_2$ and $B_3$ are contacted to the pads $P_1$, $P_2$ and $P_3$, respectively, so that a base voltage $V_1$ and a power supply voltage $V_{CC}$ are applied to the base and the collector, respectively, of the dummy bipolar transistor Q. Thus, a base current $I_B$ and a collector current $I_C$ are monitored by ampere meters $M_1$ and $M_2$, and a current amplification factor $\beta$ is calculated by $$\beta = I_C/I_B$$

In the dummy bipolar transistor circuit of FIG. 1, however, as explained above, since the collector current $I_c$ is exponentially dependent upon the base voltage $V_1$, the base voltage $V_1$ applied from the pad $P_1$ need to be very precise. Also, since the collector is connected directly to the pad $P_3$, thereby inviting a parasitic oscillation due to a high frequency operation of the bipolar transistor Q, it is impossible to precisely measure the current amplification factor $\beta$.

Figure 2:
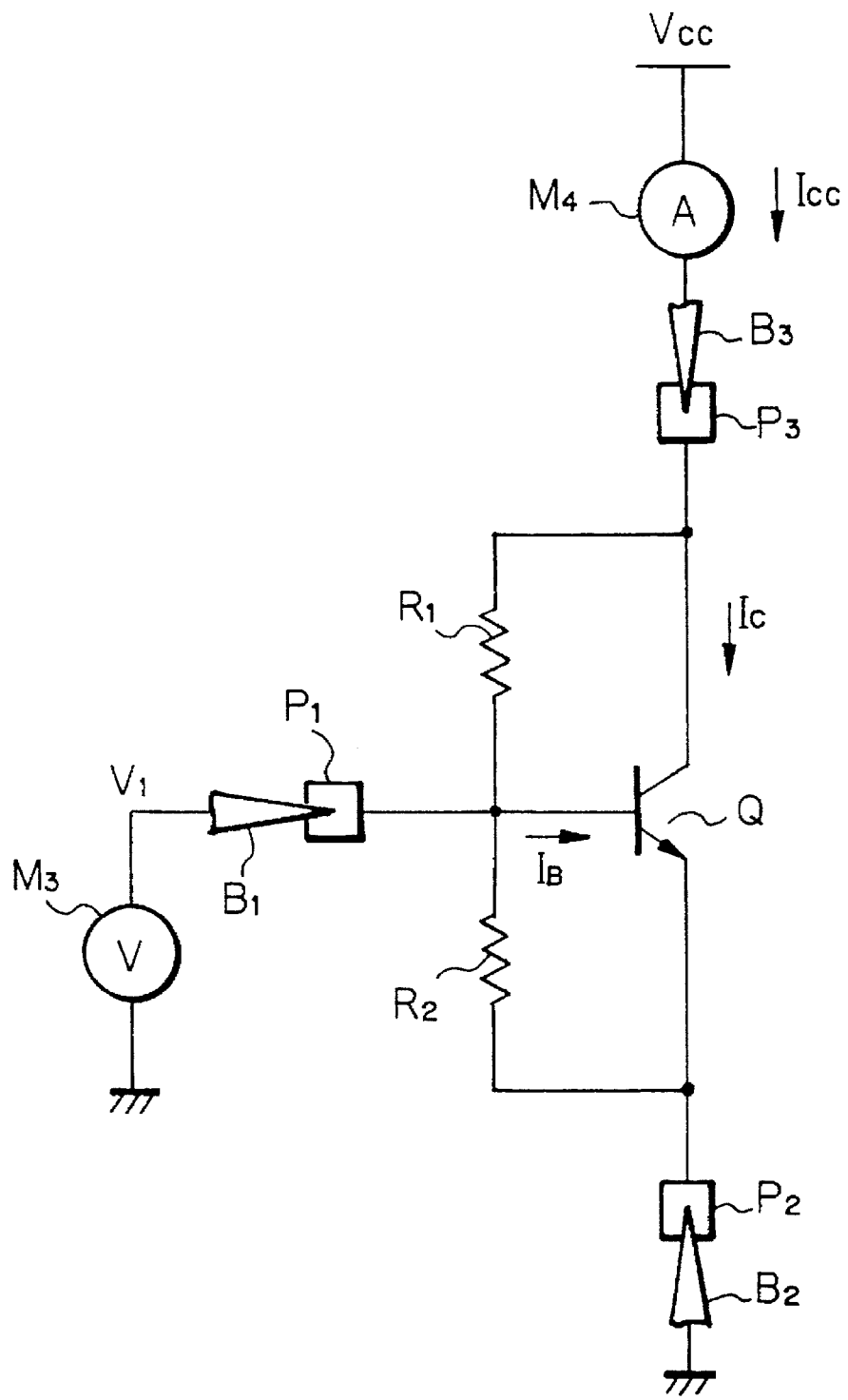
FIG. 2 is a circuit diagram illustrating a second prior art dummy bipolar transistor circuit.

In FIG. 2, which illustrates a second prior art dummy bipolar transistor circuit, resistors $R_1$ and $R_2$ are added to the dummy bipolar transistor circuit of FIG. 1. That is, the resistor $R_1$ is connected between the base and the collector of the dummy bipolar transistor Q and the resistor $R_2$ is connected between the base and the voltage $V_1$ is self-biased by the resistors $R_1$ and $R_2$ without application from the exterior. In this case, the voltage $V_1$ at the pad $P_1$ and the current $I_{CC}$ flowing through the pad $P_3$ are monitored by a voltage meter $M_3$ and an ampere meter $M_4$, and the current amplication factor $\beta$ is calculated by $$\beta = \frac{R_1 \cdot I_{CC} - V_{CC} + V_1}{V_{CC} - (1 + R_1/R_2) \cdot V_1}$$

where $R_1$ is a resistance value of the resistor $R_1$;

$R_2$ is a resistance value of the resistor $R_2$; and $V_{CC}$ is a voltage at the pad $P_3$.

In the dummy bipolar transistor circuit of FIG. 2, however, as explained above, since the current amplification factor $\beta$ is dependent upon an absolute value of the resistor $R_1$ whose precision is about several tens of a percent, a measurement error of the current amplification factor $\beta$ is very large. Also, a parasitic oscillation may occur in the same way as in the circuit of FIG. 1.

Figure 3:
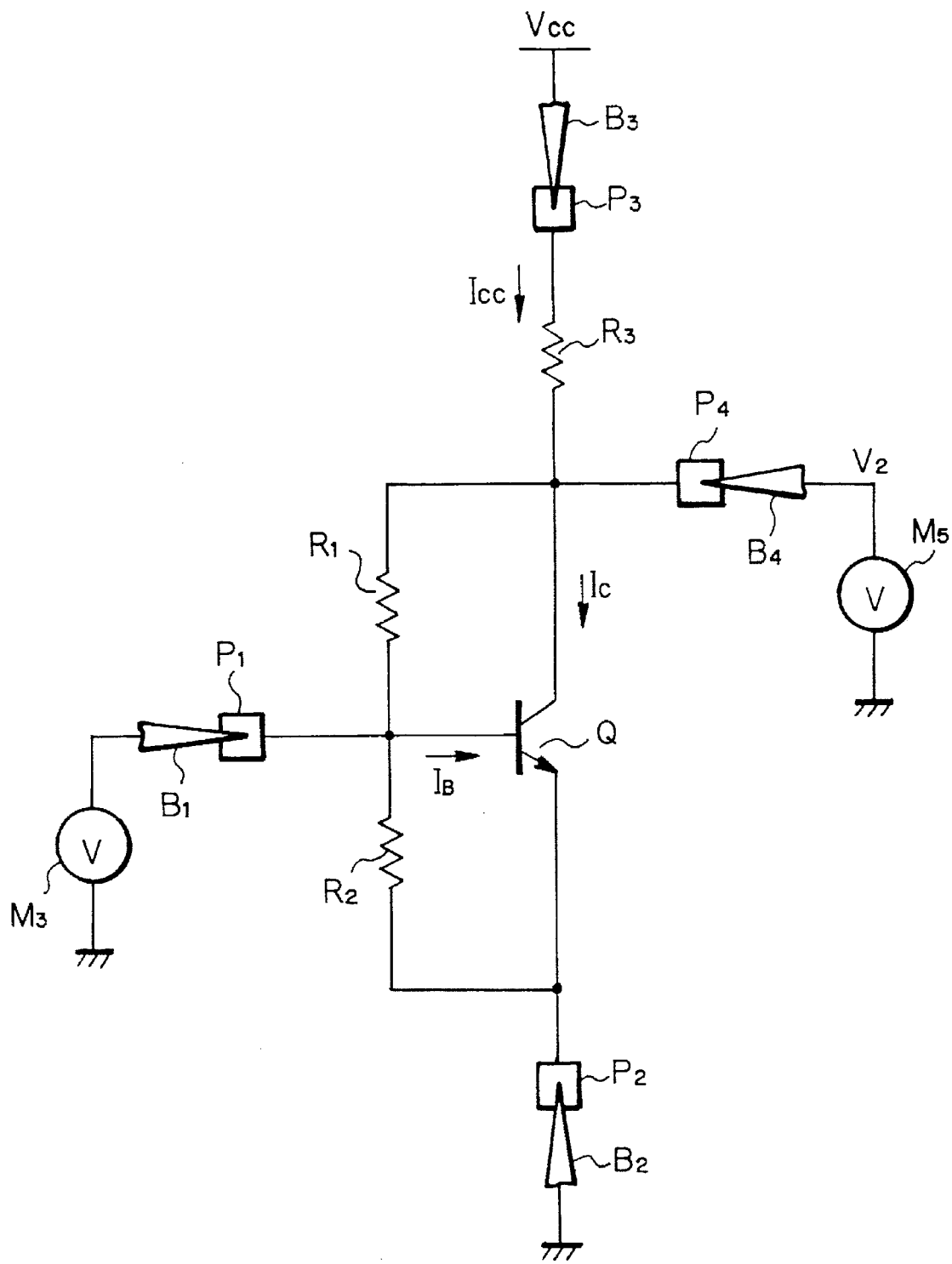
FIG. 3 is a circuit diagram illustrating an embodiment of the dummy bipolar transistor circuit according to the present invention.

In FIG. 3, which illustrates an embodiment of the present invention, a resistor $R_3$ and a pad $P_4$ are added to the circuit of FIG. 2. That is, the resistor $R_3$ is connected between the collector of the dummy bipolar transistor Q and the pad $P_3$, and the pad $P_4$ is connected to the collector of the dummy bipolar transistor Q. Also, the ampere meter $M_4$ of FIG. 2 is not provided, and instead of this, a voltage meter $M_5$ is connected by a probe $B_4$ to the pad $P_4$. Here, $I_{CC}$ is a current flowing through the pad $P_3$, $I_B$ is a base current, and $I_C$ is a collector current, a voltage $V_1$ at the pad $P_1$ is represented by $$V_1 = R_2(I_{CC} - I_C - I_B) \qquad (1)$$

Also, a voltage $V_2$ at the pad $P_4$ is represented by $$V_2 = V_1 + R_1 \cdot (I_{CC} - I_C) \qquad (2)$$

$$V_2 = V_{CC} - R_3 \cdot I_{CC} \qquad (3)$$

From the formulae (1), (2) and (3), $$\begin{aligned}\beta &= I_C/I_B \qquad (4)\\ &= (R_2/R_3) \cdot ((V_{CC} - V_2) - (R_3/R_1) \cdot (V_2 - V_1))/ \\ & \quad ((R_2/R_1) \cdot (V_2 - V_1) - V_1)\end{aligned}$$

Note that, if the voltage GND at the pad $P_2$ is not zero, the formula (4) is replaced by $$\beta = (R_2/R_3) \cdot ((V_{CC} - V_2) - (R_3/R_1) \cdot (V_2 - V_1))/ ((R_2/R_1) \cdot (V_2 - V_1) - V_1 + GND) \qquad (5)$$

Thus, the current amplification factor $\beta$ is dependent upon relative values such as $R_2/R_3$, $R_3/R_1$ and $R_2/R_1$, not upon absolute values such as $R_1$, $R_2$ and $R_3$. Note that, generally in a semiconductor device, a precision of a relative value (i.e., a ratio value) of two resistors is one percent or several percent, and thus is very high. Therefore, the current amplification factor $\beta$ calculated by using the formula (5) or (6) is very accurate. Also, since the collector of the dummy bipolar transistor Q is connected via the resistor $R_3$ to the power supply pad $P_3$, parasitic oscillation hardly occurs.

Figure 4:
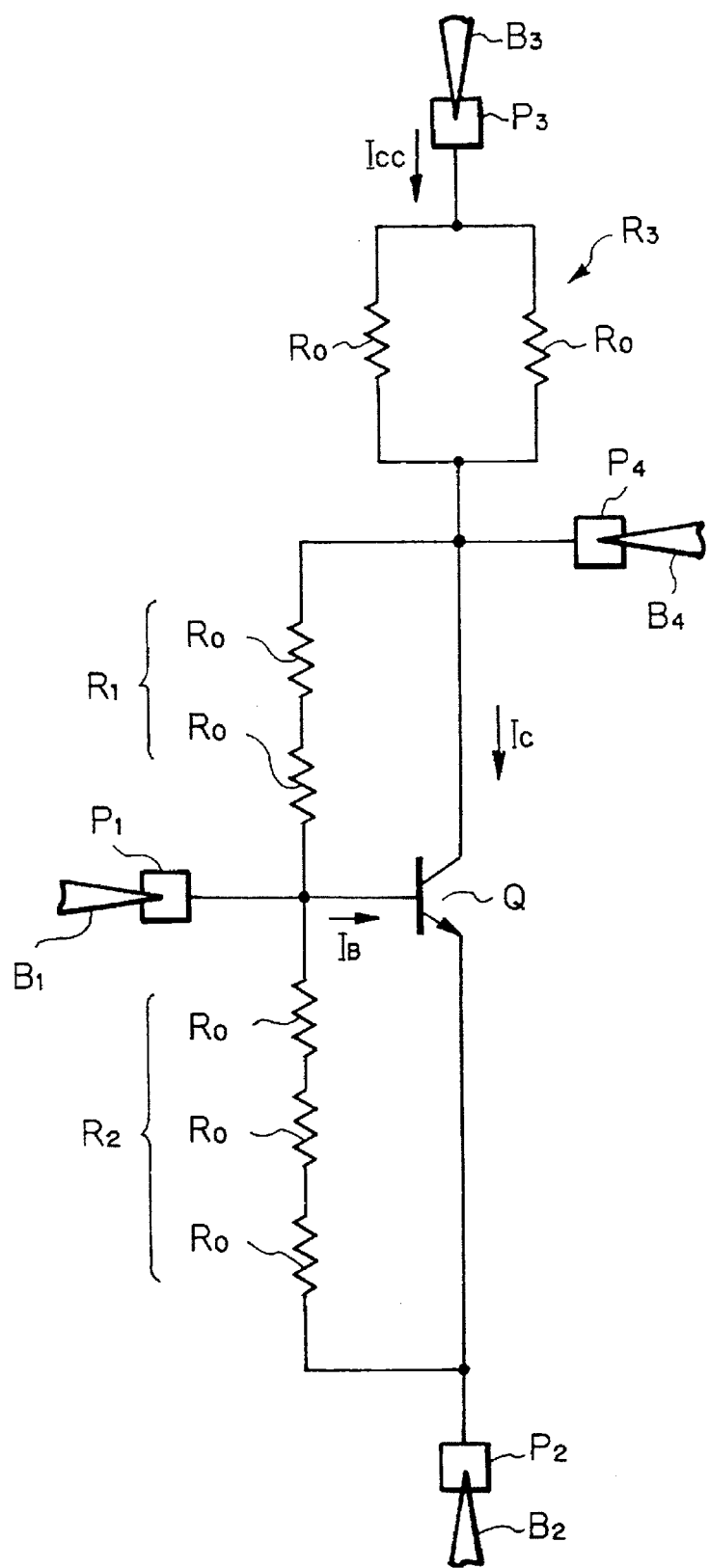
FIG. 4 is a circuit diagram of examples of the resistors in the circuit of FIG. 3.

In FIG. 4, which illustrates examples of the resistors $R_1$, $R_2$ and $R_3$ of FIG. 3, the resistors $R_1$, $R_2$ and $R_3$ are constructed by unit resistors $R_0$ in series or in parallel. For example, the resistor $R_1$ is constructed by two unit resistors $R_0$ in series, the resistor $R_2$ is constructed by three unit resistors $R_0$ in series, and the resistor $R_3$ is constructed by two unit resistors $R_0$ in parallel. In this case, $$R_1 = 2R_0$$

$$R_2 = 3R_0$$

$$R_3 = \tfrac{1}{2} R_0$$

In general, a resistance value R of a diffusion region having a width of W, a length of L and a sheet resistance of $\rho_s$ is represented by $$R = \rho_s \cdot L/W$$

For example, if $R_0 = \rho_s \cdot L_0 W_0$, $$R_1 = \rho_s \cdot (2L_0)/W_0$$

$$R_2 = \rho_s \cdot (3L_0)/W_0$$

$$R_3 = \rho_s \cdot L_0/(2W_0)$$

Therefore, each of the resistors $R_1$, $R_2$ and $R_3$ can be formed by increasing the width or length of the unit resistor $R_0$.

Figure 5:
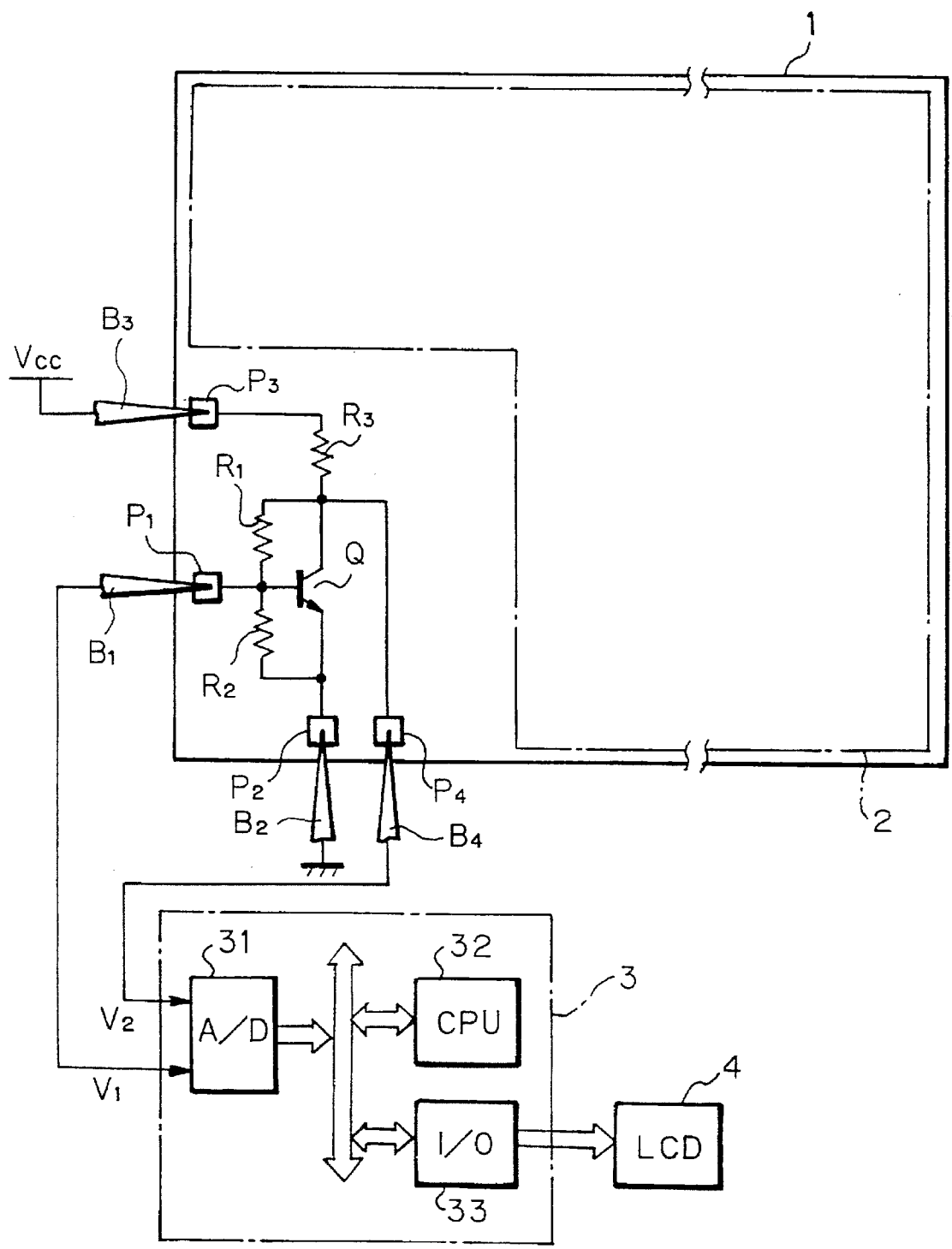
FIG. 5 is a circuit diagram of a semiconductor device incorporating the dummy bipolar-transistor circuit of FIG. 3.

In FIG. 5, which illustrates a semiconductor device incorporating the dummy bipolar transistor circuit of FIG. 3, reference numeral 1 designates a semiconductor device including a main circuit 2 such as a memory cell array. The dummy bipolar transistor circuit is isolated from the main circuit 2. The ground voltage GND and the power supply voltage $V_{CC}$ are applied via the probes $B_2$ and $B_3$ to the pads $P_2$ and $P_3$, respectively. Also, the pads $P_1$ and $P_4$ are connected via their probes $B_1$ and $B_4$ to a control circuit 3 which is constructed by a microcomputer, for example, the control circuit 3 includes an analog/digital (A/D) converter 31, a central processing unit (CPU) 32, an input/output (I/O) interface 33, and the like.

In the control circuit 3, the voltages $V_1$ and $V_2$ at the pads $P_1$ and $P_4$ are fetched by the A/D converter 31. Then, the CPU 32 calculates a current amplification factor β by using the formula (4) or (5), and transmits it to an output apparatus such as a liquid crystal display (LCD) unit 4.

Figure 6:
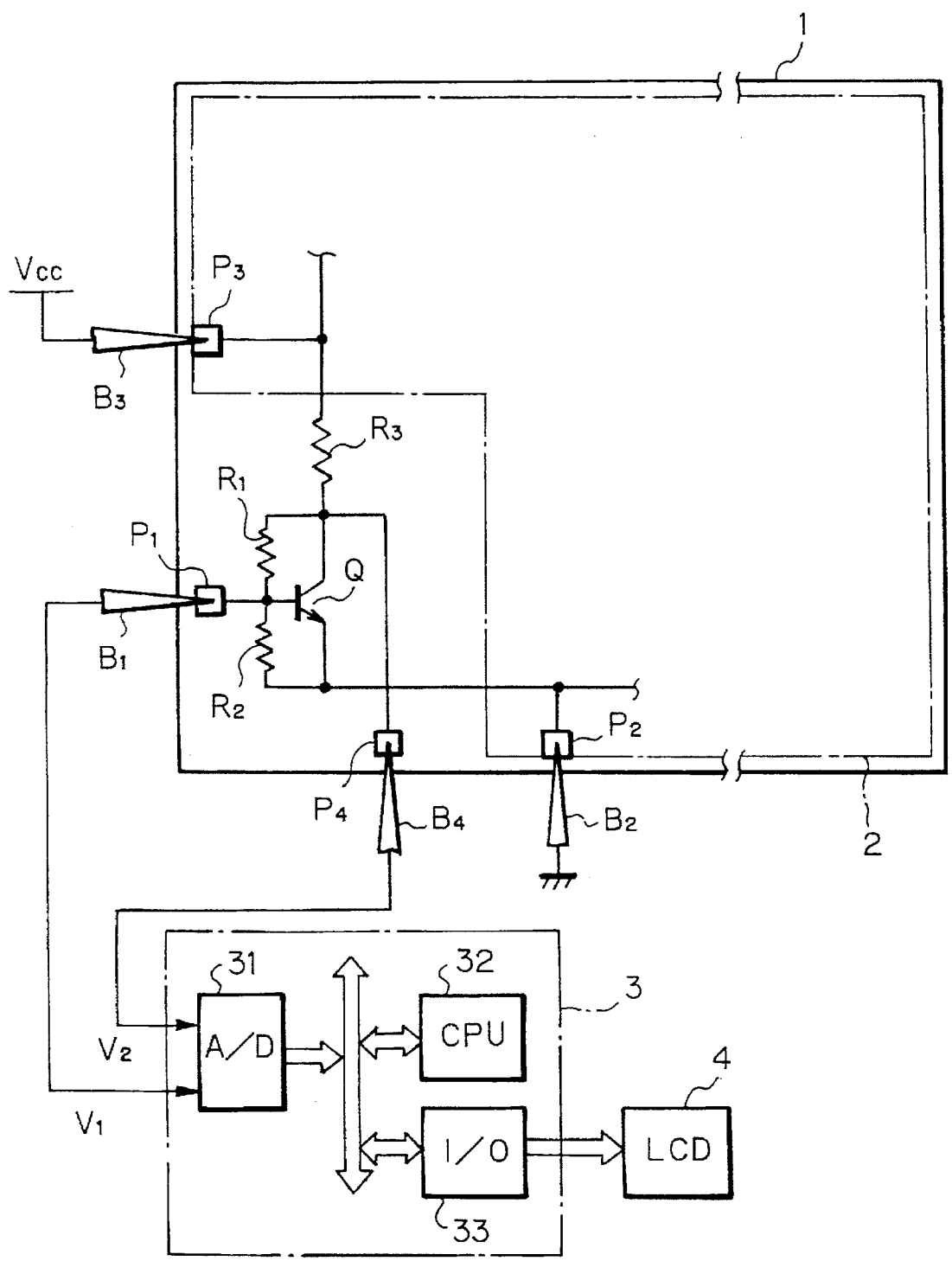
FIG. 6 is a circuit diagram of another semiconductor device incorporating the dummy bipolar transistor circuit of FIG. 3.

In FIG. 6, which illustrates a semiconductor device incorporating the dummy bipolar transistor circuit of FIG. 3, the pads $P_2$ and $P_3$ are incorporated into the main circuit 2, thus reducing the number of pads. This contributes to the enhancement of the integration.

As explained thereinbefore, according to the present invention, an accurate and easy measurement of a current amplification factor can be carried out for a dummy bipolar transistor, without inviting a parasitic oscillation.

I claim:

1. A semiconductor device comprising:
   a dummy bipolar transistor having a base, a collector, and an emitter for a current amplification factor measurement;
   a first resistor connected between the base and the collector of said dummy bipolar transistor;
   a second resistor connected between the base and the emitter of said dummy bipolar transistor;
   a third resistor connected to the collector of said dummy bipolar transistor;
   a first pad connected to the base of said dummy bipolar transistor;
   a second pad connected to the emitter of said dummy transistor;
   a third pad connected to said third resistor; and
   a fourth pad connected to the collector of said dummy bipolar transistor,
   wherein said semiconductor device accurately provides said current amplification factor measurement irrespective of a parasitic oscillation of said transistor and an absolute value of said first resistor,
   wherein said first pad is connected to a voltage meter, said second pad is connected to a first external power supply means, said third pad is connected to a second external power supply means, and said fourth pad is connected to a second voltage meter.

2. A semiconductor device comprising:
   a dummy bipolar transistor having a base, a collector, and an emitter for a current amplification factor measurement;
   a first resistor connected between the base and the collector of said dummy bipolar transistor;
   a second resistor connected between the base and the emitter of said dummy bipolar transistor;
   a third resistor connected to the collector of said dummy bipolar transistor;
   a first pad connected to the base of said dummy bipolar transistor;
   a second pad connected to the emitter of said dummy transistor;
   a third pad connected to said third resistor; and
   a fourth pad connected to the collector of said dummy bipolar transistor,
   wherein said semiconductor device accurately provides said current amplification factor measurement irrespective of a parasitic oscillation of said transistor and an absolute value of said first resistor,
   wherein said second and third pads are connected to first and second external power supply means, respectively, and
   said first and fourth pads are connected to an external control circuit for calculating a current amplification factor β by $$\beta=(R_2/R_3) \cdot ((V_{CC}-GND-V_2)-(R_3/R_1) \cdot (V_2-V_1))/ ((R_2/R_1) \cdot (V_2-V_1)-V_1+GND)$$

where $R_1$, $R_2$ and $R_3$ are resistance values of said first, second and third resistors, respectively;
   GND is a voltage of said first power supply means;
   $V_{CC}$ is a voltage of said second power supply means;
   $V_1$ is a voltage at said first pad; and
   $V_2$ is a voltage at said fourth pad.

3. An apparatus for measuring a current amplification factor of a dummy bipolar transistor having a base, a collector, and an emitter formed in a semiconductor substrate, said semiconductor substrate including:
   a first resistor connected between the base and the collector of said dummy bipolar transistor;
   a second resistor connected between the base and the emitter of said dummy bipolar transistor;
   a third resistor connected to the collector of said dummy bipolar transistor;
   a first pad connected to the base of said dummy bipolar transistor;
   a second pad connected to the emitter of said dummy bipolar transistor;
   a third pad connected to said third resistor; and
   a fourth pad connected to the collector of said dummy bipolar transistor, wherein said semiconductor device accurately provides said current amplification factor measurement irrespective of a parasitic oscillation of said transistor and an absolute value of said first resistor,
   said apparatus comprising:
   a first power supply means connected to said second pad;
   a second power supply means connected to said third pad;
   a first voltage meter connected to said first pad; and
   a second voltage meter connected to said fourth pad a dummy bipolar transistor.

4. An apparatus for measuring a current amplification factor of a dummy bipolar transistor having a base, a collector, and an emitter formed in a semiconductor substrate, said semiconductor substrate including:
   a first resistor connected between the base and the collector of said dummy bipolar transistor;
   a second resistor connected between the base and the emitter of said dummy bipolar transistor;
   a third resistor connected to the collector of said dummy bipolar transistor;
   a first pad connected to the base of said dummy bipolar transistor;

a second pad connected to the emitter of said dummy transistor;

a third pad connected to said third resistor; and a fourth pad connected to the collector of said dummy bipolar transistor, wherein said semiconductor device accurately provides said current amplification factor measurement irrespective of a parasitic oscillation of said transistor and an absolute value of said first resistor, said apparatus comprising:

a first power supply means connected to said second pad;

a second power supply means connected to said third pad; and a control circuit, connected to said first and fourth pads, for calculating a current amplification factor $\beta$ by $$\beta = (R_2/R_3) \cdot ((V_{CC} - V_2) - (R_3/R_1) \cdot (V_2 - V_1)) / ((R_2/R_1) \cdot (V_2 - V_1) - V_1 + GND)$$

where $R_1$, $R_2$ and $R_3$ are resistance values of said first, second and third resistors, respectively, GND is a voltage of said first power supply means, $V_{CC}$ is a voltage of said second power supply means, $V_1$ is a voltage at said first pad, and $V_2$ is a voltage at said fourth pad.

\* \* \* \* \*